United States Patent
Fantini et al.

(10) Patent No.: US 10,418,552 B1
(45) Date of Patent: Sep. 17, 2019

(54) TRANSITION METAL DOPED GERMANIUM-ANTIMONY-TELLURIUM (GST) MEMORY DEVICE COMPONENTS AND COMPOSITION

(71) Applicant: Micron Technology, Inc., Boise, ID (US)

(72) Inventors: Paolo Fantini, Vimercate (IT); Marco Bernasconi, Busto Arsizio (IT); Silvia Gabardi, Barzanò (IT)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/107,930

(22) Filed: Aug. 21, 2018

(51) Int. Cl.
*H01L 45/00* (2006.01)
*G11C 13/00* (2006.01)
*G11C 8/14* (2006.01)
*G11C 7/18* (2006.01)

(52) U.S. Cl.
CPC ............. *H01L 45/144* (2013.01); *G11C 7/18* (2013.01); *G11C 8/14* (2013.01); *G11C 13/0004* (2013.01); *G11C 13/004* (2013.01); *G11C 13/0023* (2013.01); *H01L 45/06* (2013.01); *H01L 45/1253* (2013.01)

(58) Field of Classification Search
CPC .... H01L 45/06; H01L 45/144; G11C 13/0004
See application file for complete search history.

(56) References Cited

U.S. PATENT DOCUMENTS

| | | | | |
|---|---|---|---|---|
| 2011/0049456 | A1* | 3/2011 | Lung | H01L 45/06 257/2 |
| 2014/0268991 | A1* | 9/2014 | Hu | G11C 13/0002 365/148 |
| 2018/0315921 | A1* | 11/2018 | Rao | H01L 45/06 |
| 2019/0088869 | A1* | 3/2019 | Han | H01L 27/2481 |

* cited by examiner

*Primary Examiner* — Allison Bernstein
(74) *Attorney, Agent, or Firm* — Holland & Hart LLP

(57) ABSTRACT

Methods, systems, and devices for operating memory cell(s) using transition metal doped GST are described. As discussed herein, a composition including germanium (Ge), antimony (Sb), tellurium (Te), and at least one of yttrium (Y) and scandium (Sc) may be used as a memory element in a memory cell. For example, a memory element may include a composition having Ge in an amount ranging from 15 to 35 atomic percent (at. %) of the composition, Sb in an amount less than or equal to 50 at. % of the composition, Te in an amount greater than or equal to 40 at. % of the composition, and at least one of Y and Sc in an amount ranging from 0.15 to 10 at. % of the composition.

25 Claims, 7 Drawing Sheets

US 10,418,552 B1

TRANSITION METAL DOPED GERMANIUM-ANTIMONY-TELLURIUM (GST) MEMORY DEVICE COMPONENTS AND COMPOSITION

BACKGROUND

The following relates generally to operating a memory array and more specifically to transition metal doped germanium (Ge)-antimony (Sb)-tellurium (Te) (GST) and related memory devices.

Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory (e.g., FeRAM, PCM, RRAM) may maintain their stored logic state for extended periods of time even in the absence of an external power source. Volatile memory devices (e.g., DRAM) may lose their stored state over time unless they are periodically refreshed by an external power source.

Chalcogenide material compositions may be used in components of a phase change memory cell—e.g., in a selector device or memory element. These components may have a first threshold voltage at which they become conductive (current is allowed to flow through the composition) when in an amorphous state and a different threshold voltage when in a crystalline state, and the difference between the first threshold voltage and the second threshold voltage may be referred to as threshold voltage window. In some cases, a sensing window of a phase change memory cell depends on the threshold voltage window of a corresponding chalcogenide material—e.g., a sensing window may increase as the threshold voltage window of the chalcogenide material increases. However, memory components having larger threshold voltage windows may in some cases also have slower crystallization (or SET) speeds (the speed with which the composition transitions from an amorphous to a crystalline state), which may decrease the operational speed of a corresponding memory cell. Improved memory devices are desired.

DETAILED DESCRIPTION

Figure 1:
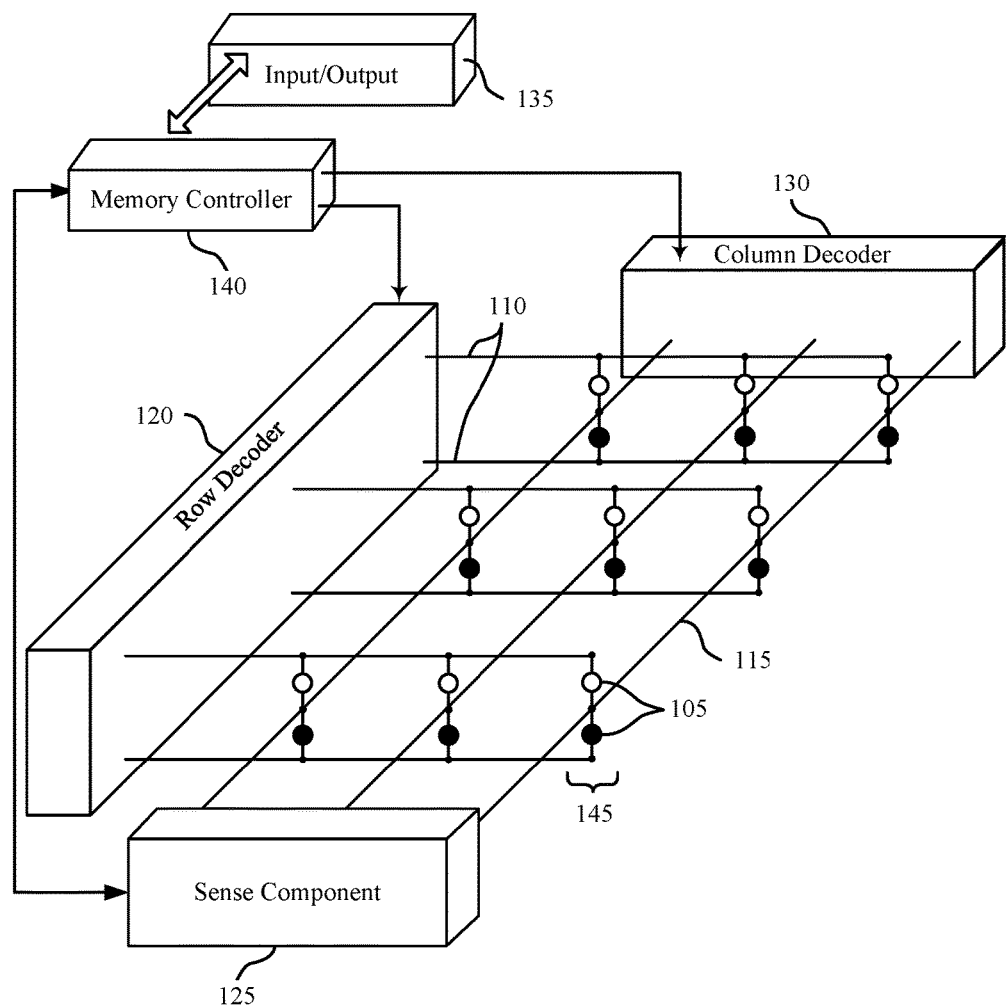
FIG. 1 illustrates an example of a memory array that supports transition metal doped germanium-antimony-tellurium (GST) in accordance with various aspects of the present disclosure.

Electronic data may be stored in memory cells containing memory elements that are electronically programmable (e.g., by way of applying a voltage or current) to have different resistivity (e.g., a resistance or threshold voltage). For example, a logic value may be stored in a memory cell by changing a resistivity of a corresponding memory element, where a first resistivity of the memory element corresponds to a first logic value and a second resistivity of the memory element corresponds to a second logic value.

A memory element having an electronically programmable resistivity may include a material that exhibits a different resistivity based on a phase of the material—e.g., based on whether the material is in an amorphous phase or a crystalline phase. One example of these materials may include or be referred to as phase change materials. In some examples, a memory element containing a phase change material in a first phase (e.g., the amorphous phase) may exhibit a first resistance and/or have a first threshold voltage and the memory element containing the phase change material in a second phase (e.g., the crystalline phase) may exhibit a second resistance and/or have a second threshold voltage. In some cases, the first threshold voltage may be greater than the second threshold voltage and the difference between the first threshold voltage and the second threshold voltage may be referred to as the threshold voltage window for the memory element.

The different programmable resistivity states of a memory element may depend on physical characteristics of the memory element, such as a composition of the phase change material included in the memory element and a size of the memory element, among other factors. In some cases, a threshold voltage, and thus a threshold voltage window, of a memory element may be correlated with a bandgap of the phase change material—e.g., the threshold voltage window of the memory element may increase as the bandgap of the phase change material increases, and vice versa. A bandgap of a phase change material may be based on a molecular structure of the phase change material. In some cases, a bandgap of the phase change material may be based on electronegativity of the different elements.

Accordingly, certain phase change materials may have higher or lower bandgaps based on a particular combination of elements making up the phase change material. For instance, a phase change material that includes indium (In), antimony (Sb), and tellurium (Te) (which may be referred to as IST) or In, germanium (Ge), and Te (which may be referred to as IGT) may have a large bandgap, whereas a phase change material that includes only Ge, Sb, and Te (which may be referred to as GST) may have a narrow bandgap. The threshold voltage window of a memory element may also be correlated with a size of the memory element—e.g., the threshold voltage window of a memory element may decrease as a size of the memory element decreases, and vice versa.

In some examples, a phase of a phase change material in a memory element may be changed to store a logic value at a corresponding memory cell—e.g., during a write operation. In some examples, a phase of a phase change material may be changed by applying one or more voltages across (or currents to—e.g., through) the phase change material, heating the material to at least a certain temperature (which may be referred to as the glass transition temperature or melting temperature) and cooling the material (which may also be referred to as quenching) by removing or altering the applied voltage or current so as to cause a phase of the phase change material to transition from one phase to another phase. The different phases of the phase change materials may correspond to particular logic values. For example, when the phase change material is in the amorphous phase, a corresponding memory element/cell may store a first logic value (e.g., have a first resistivity) and when the phase change memory material is in the crystalline phase, the corresponding memory element/cell may store a second logic value (e.g., have a second resistivity).

The speed with which a memory element including a phase change material transitions from the amorphous to the crystalline phase may be referred to as a "SET speed" of the memory element, and the speed with which the memory element transitions from the crystalline phase to the amorphous phase may be referred to as a "RESET speed" of the memory element. Similarly, the time required for transitioning a phase change material of a memory element from an amorphous to crystalline phase may be referred to as a "SET duration" and the time required for transitioning a phase change material of a memory element from a crystalline to amorphous phase may be referred to as a "RESET duration."

Like the threshold voltage window of a memory element, a SET speed of a memory element may be based on a molecular structure of a phase change material in the memory element. In some cases, the SET speed/duration may be a function of the number of four-fold rings in a composition, which may act as nuclei for crystallization—e.g., a composition with a large number of four-fold rings may have a faster SET speed/shorter SET duration than a composition with less four-fold rings. Accordingly, certain memory elements may have faster or slower SET speeds based on a particular combination of elements making up the phase change materials in a memory element.

In some cases, a SET speed of a memory element is inversely correlated with a bandgap of a phase change material in the memory element—e.g., as the bandgap of a phase change material decreases, the SET speed of a corresponding memory element quickens, and vice versa. For instance, memory elements using phase change materials having compositions with large bandgaps, such as IST and IGT, may have slow SET speeds. This relationship occurs because the addition of elements that increase a bandgap of a phase change material also typically reduces the number of four-fold rings in the phase change material.

In some examples, a phase of a phase change material in a memory element may be used to determine a logic value stored at a corresponding memory cell—e.g., during a read operation to provide requested data to a requesting device (e.g., a memory component or external device). For example, a logic value stored in a memory cell may be determined by sensing a resistivity of a memory element contained in the memory cell. Among other techniques, the resistivity of the storage element may be sensed by applying a voltage to a memory cell and determining whether, or how much, current flows through the memory cell. In such cases, the larger the difference in resistivity of the memory element between different phases, the more reliably (e.g., with lower error rates) the logic values stored at the memory cell may be determined (e.g., sensed or read). In some examples, the difference between the resistivity of different logic states is referred to as the sensing window (or read window or memory window) of a memory cell, where a larger sensing window may be desirable.

In some cases, a sensing window of a memory cell is increased as the threshold voltage window of a corresponding memory element is increased. As discussed herein, the bandgap of a phase change material may be correlated with a threshold voltage window of a memory element, and thus, a sensing window of a memory cell may also be correlated with the bandgap of a phase change material—e.g., the sensing window of a memory cell may increase as the bandgap of a phase change material of a corresponding memory element increases, and vice versa. Accordingly, memory elements including phase change materials with wider bandgaps (or a "wide bandgap memory element"), such as IST or IGT, may result in larger sensing windows for a memory cell than memory elements including phase change materials with narrower bandgaps (or a "narrow bandgap memory element"), such as GST. But, as also discussed herein, the SET speed for wide bandgap memory elements is often slower than the SET speed for narrow bandgap memory elements.

This relationship between sensing window and SET speed—i.e., as the sensing window increases, the SET speed become slower—may result in a trade-off between the reliability afforded by larger sensing windows and faster throughput afforded by quicker SET speeds. In some cases, a SET speed for a wide bandgap memory element may be insufficient to satisfy timing constraints of a memory operation. As such, in some cases, a narrow bandgap memory element may be used instead of the wide bandgap memory element, despite the narrow bandgap memory element resulting in a smaller sensing window for the corresponding memory cell—e.g., to meet timing constraints.

The undesirable effects of the relationship between sensing window and SET speed may be emphasized as a size of a memory array is decreased. As a phase change memory array is decreased in size, memory elements may also be decreased in size—e.g., decreased in height, width, and/or depth—so that a similar or greater memory capacity may be achieved within a smaller footprint. And as discussed herein, as a size of a memory element containing a phase change material is reduced, a threshold voltage window of the memory element may also decrease. To accommodate for this size-based reduction in threshold voltage window, wide bandgap memory elements may be used in more compact memory arrays—e.g., to maintain a similar sensing window and reliability for a corresponding memory cell. But as discussed herein, wide bandgap memory elements containing are often correlated with slower SET speeds. And in some cases, the addition of a wide bandgap memory element may result in non-compliant memory operation—e.g., a failure to meet timing constraints of a memory operation.

To increase throughput, memory density, and/or reliability of a memory cell, a memory element containing a phase change material having both a large bandgap and a fast SET speed is desirable.

As discussed herein, a phase change material having both a large bandgap and a desirable SET speed may include a combination of Ge, Sb, Te, and at least one transition metal element selected from Group III of the periodic table—such as yttrium (Y) or scandium (Sc)—which may also be referred to as a Group III-Transition Metal (Group III-TM). In some examples, the phase change material may be a Te-rich composition including Ge in an amount ranging from 15 to 35 atomic percent (at. %); Sb in an amount less than or equal to 50 at. %; Te in an amount greater than or equal to 40 at. %; and at least one of Y or Sc in an amount ranging from 0.15 at. % to 10 at. %. As discussed herein, a composition created in accordance with the previous combination may have a large bandgap (e.g., between 0.6 and 0.9 electronvolts (eVs)) and a desirable SET speed (e.g., less than 10 µs). In some cases, the amount of Te included in the composition by atomic percent may be greater than 1) the amount of Ge included in the composition by atomic percent, 2) the amount of Sb included in the composition by atomic percent, or 3) the amount of Y and/or Sc included in the composition by atomic percent. In some cases, as the amount of Y and/or Sc in the composition is increased, a corresponding amount of Sb in the composition is decreased—e.g., a proportional amount.

When a material as disclosed herein is incorporated into a memory element, the memory element may have a larger threshold voltage window. For example, a threshold voltage for a memory element having a given height and width may increase based on incorporating the material. Further, a memory element may benefit from this increase in threshold voltage window while maintaining SET speed (at least substantially or relative to other chemistries with comparable threshold voltage windows). For example, when a material of this composition is incorporated into a memory element, the memory element may have SET duration of less than 10 µs. Thus, by using such a material in a memory element, a reliability of a corresponding memory cell may be increased—e.g., by enlarging a sensing window—without adversely affecting (or at least mitigating any adverse impact on) a throughput of a memory array.

Also, when a material as disclosed herein is incorporated into a memory element the benefits of a larger threshold voltage window for the memory element may be maintained as a size of the memory element is decreased, while maintaining SET speed. For example, a threshold voltage for a memory element having a reduced height and/or width may increase based on incorporating the material, with little to no reduction in SET speed. Thus, by using such a material in a memory element, a density of a memory array may be increased within a footprint—e.g., by reducing a size of the memory cells—without adversely affecting a reliability of the memory array—e.g., by having a same sensing window for the memory cells as for the memory cells used in a less dense memory array having the same footprint.

Features of the disclosure introduced above are further described below in the context of a memory system. Specific examples are then described of example compositions for transition metal doped GST and related memory devices. These and other features of the disclosure are further illustrated by and described with reference to apparatus diagrams, system diagrams, and flowcharts that relate to transition metal doped GST and related memory devices.

FIG. 1 illustrates an example of a memory array that supports transition metal doped GST in accordance with various aspects of the present disclosure. Memory array 100 may be configured to store electronic information and may include and may also be referred to as an electronic memory apparatus. Memory array 100 includes memory cells 105 that are programmable to store different states.

Each memory cell 105 may be programmable to store two states, denoted a logic 0 and a logic 1. In some cases, memory cell 105 is configured to store more than two logic states. A memory cell 105 may store charge representative of the programmable states in a capacitor; for example, a charged and uncharged capacitor may represent two logic states, respectively. DRAM architectures may commonly use such a design, and the capacitor employed may include a dielectric material with linear or para-electric electric polarization properties as the insulator. A ferroelectric memory cell may similarly include a capacitor but with a ferroelectric as the insulating material. Different levels of polarization of a ferroelectric capacitor may represent different logic states. Ferroelectric materials have non-linear polarization properties and a ferroelectric material may store information when a voltage is not present across the ferroelectric material. Or in some cases, chalcogenide-based and/or phase change materials may be employed. Chalcogenides described herein may be in PCM storage elements or selector devices, or both.

Memory array 100 may be a three-dimensional (3D) memory array, where two-dimensional (2D) memory arrays are formed on top of one another. This may increase the number of memory cells that may formed on a single die or substrate as compared with 2D arrays, which in turn may reduce production costs or increase the performance of the memory array, or both. According to the example depicted in FIG. 1, memory array 100 includes two levels of memory cells 105 and may thus be considered a three-dimensional memory array; however, the number of levels is not limited to two. Each level may be aligned or positioned so that memory cells 105 may be approximately aligned with one another across each level, forming a memory cell stack 145. In accordance with the teachings herein, memory array 100 may include a composition that includes Ge, Sb, Te, Sc, or Y, or some combination of these elements.

Each row of memory cells 105 is connected to an access line 110, and each column of memory cells 105 is connected to a bit line 115. Access lines 110 may also be known as word lines 110, and bit lines 115 may also be known digit lines 115. References to word lines and bit lines, or their analogues, are interchangeable without loss of understanding or operation. Word lines 110 and bit lines 115 may be substantially perpendicular to one another to create an array. The two memory cells 105 in a memory cell stack 145 may share a common conductive line such as a digit line 115. That is, a digit line 115 may be in electronic communication with the bottom electrode of the upper memory cell 105 and the top electrode of the lower memory cell 105. Other configurations may be possible, for example, a third layer may share a word line 110 with a lower layer. Or, the first and second layers may both have their own word and bit line. That is, the top electrode of lower memory cell 105 may be in electronic communication with a first digit line and the bottom electrode of upper memory cell 105 may be in electronic communication with a second digit line. In some cases, a third access line may be present and may be used to activate and deactivate a selector device.

In general, one memory cell 105 may be located at the intersection of two conductive lines such as a word line 110 and a bit line 115. This intersection may be referred to as a memory cell's address. A target memory cell 105 may be a memory cell 105 located at the intersection of an energized word line 110 and bit line 115; that is, a word line 110 and bit line 115 may be energized in order to read or write a memory cell 105 at their intersection. Other memory cells 105 that are in electronic communication with (e.g., connected to) the same word line 110 or bit line 115 may be referred to as untargeted memory cells 105.

As discussed herein, electrodes may be coupled to a memory cell 105 and a word line 110 or a bit line 115. The term electrode may refer to an electrical conductor, and in some cases, may be employed as an electrical contact to a memory cell 105. An electrode may include a trace, wire, conductive line, conductive layer, or the like that provides a conductive path between elements or components of memory array 100.

Operations such as reading and writing may be performed on memory cells 105 by activating or selecting a word line 110 and bit line 115, which may include applying a voltage or a current to the respective line. Word lines 110 and bit lines 115 may be made of conductive materials, such as metals (e.g., copper (Cu), aluminum (Al), gold (Au), tungsten (W), titanium (Ti), etc.), metal alloys, carbon, conductively doped semiconductors, or other conductive materials, alloys, or compounds.

Memory cells 105 may each have a memory element and a selector device. A resistivity of a memory element may be programmed to correspond to a particular logic state. In some cases, a memory element may include a phase change material. For example, a memory element may be or include a chalcogenide material including a particular combination of the elements Ge, Sb, and Te, which may be referred to as a GST composition. In some cases, a GST composition may be doped with other elements, such as In—e.g., to increase a bandgap of the GST composition. However, doping a GST composition with elements such as In may cause a SET speed of the composition to decrease (i.e., may cause the transition of the composition from an amorphous to a crystalline phase to take longer).

To increase a bandgap of a GST compound with little to no decrease, and in some cases an increase, in SET speed, GST may be doped with at least one Group III-TM element—e.g., such as Y and/or Sc. In some cases, doping a GST composition by incorporating a Group III-TM element into the GST composition may be accompanied by a corresponding decrease in an amount of Sb in the GST composition. In some cases, a transition metal doped GST may have a bandgap between 0.6 eV and 0.9 eV and a SET duration that is less than 10 μs.

A selector device may be used to temporarily isolate a memory cell 105 from the rest of memory array 100. For example, a memory cell 105 may be accessed when a selector device is biased. In some cases, a selector device may include a metal-oxide-semiconductor field-effect transistor (MOSFET), bipolar junction transistor (BJT), diode, or ovonic threshold switch (OTS). In some cases, a selector device may include a phase change material, such as a chalcogenide material. The selection of memory cell 105 may be a function of the threshold voltage of the selector device.

Accessing memory cells 105 may be controlled through a row decoder 120 and a column decoder 130. For example, a row decoder 120 may receive a row address from the memory controller 140 and activate the appropriate word line 110 based on the received row address. Similarly, a column decoder 130 receives a column address from the memory controller 140 and activates the appropriate bit line 115. Thus, by activating a word line 110 and a bit line 115, a memory cell 105 may be accessed.

Upon accessing, a memory cell 105 may be read, or sensed, by sense component 125. For example, sense component 125 may be configured to determine the stored logic state of memory cell 105 based on a signal generated by accessing memory cell 105. The signal may include a voltage or electrical current, and sense component 125 may include voltage sense amplifiers, current sense amplifiers, or both. For example, a current may be applied to a memory cell 105 and the magnitude of the voltage to create the current may depend on the electrical resistance or threshold voltage of the memory cell 105. Likewise, a voltage may be applied to a memory cell 105 (using the corresponding word line 110 and bit line 115) and the magnitude of the resulting current may depend on the electrical resistance and/or threshold voltage of the memory cell 105. In some cases, two or more different currents may develop based on a logic state of memory cell 105. The difference between the two or more different currents may be referred to as the memory (or sensing) window.

In some cases, a memory cell with a larger sensing window is more reliable than (e.g., may have less read errors) a memory cell having a smaller sensing window. In some cases, the sensing window corresponds to a threshold voltage window of a memory element in a memory cell 105. In some cases, a sensing window of a memory cell 105 may be increased by increasing a threshold voltage window of the memory element included in the memory cell, where a threshold voltage window of the memory element may be increased by including a high bandgap phase change material in the memory element. In some cases, a sensing window of a memory cell 105 may be increased by using a memory element including a transition metal doped GST compound, such as Y-GST or Sc-GST.

Sense component 125 may include various transistors or amplifiers in order to detect and amplify a signal, which may be referred to as latching. The latched signal may correspond to a logic state of memory cell 105 and may be output as output 135. In some cases, the accuracy of sense component 125 is dependent on a sensing window for a memory cell. For example, a larger sensing window may allow for more variation in the voltage or current induced on a digit line 115 by a memory cell 105 and provided to the sense component 125 for sensing. In some cases, sense component 125 may be a part of column decoder 130 or row decoder 120. Or, sense component 125 may be connected to or in electronic communication with column decoder 130 or row decoder 120.

A memory cell 105 may be set, or written, by similarly activating the relevant word line 110 and bit line 115—i.e., a logic value may be stored in the memory cell 105. Column decoder 130 or row decoder 120 may accept data, for example input/output 135, to be written to the memory cells 105. In the case of phase change memory, a memory cell 105 may be written by heating the memory element, for example, by passing a current through the memory element until the memory element reaches a certain temperature, which may be referred to as a glass transition temperature. After reaching the glass transition temperature, the memory element may be quenched so as to, after cooling, be in a different phase than an initial phase. The speed with which the memory element transitions from an amorphous phase to a crystalline phase may be referred to as the crystallization speed or SET speed. In some cases, the SET speed limits the speed at which a logic state may be written to a memory cell 105. In some examples, the duration for transitioning a memory element from an amorphous phase to a crystalline phase (which may be referred to as the SET duration) may exceed one or more timing constraints of a memory operation. In some cases, a SET speed of a memory cell 105 may be increased or maintained without reducing or increasing a sensing window of the memory cell 105 by using a memory element including a transition metal doped GST compound, such as Y-GST or Sc-GST, in the memory cell 105.

In some cases, as a size of memory cells 105 is decreased (e.g., as a size of memory array 100 is decreased), and/or as the size of a memory element 220 is decreased (e.g., to have a height between 20 and 30 nm and width between 5 and 20 nm), a threshold voltage window of a memory element contained by the memory cell 105, along with a sensing window of the memory cell 105, may also decrease. In some cases, a memory element includes a phase change material having a wide bandgap (or a "wide bandgap memory element") may be used by a reduced-size memory cell 105 to counteract the reduction in threshold voltage window. However, the wide bandgap memory element may be associated with a slower SET duration and the reduced-size memory cell 105 may lose compliance with one or more memory system requirements—e.g., may fail to meet one or more timing constraints.

As discussed herein, a wide bandgap memory element may include a chalcogenide material including a particular combination of Ge, Sb, Te, and at least one Group III-TM element, such as Y and/or Sc. For example, the wide bandgap memory element may include Ge in an amount ranging from 15 to 35 at. %; Sb in an amount less than or equal to 40 at. %; Te in an amount greater than or equal to 40 at. %; and at least one of Y or Sc in an amount ranging from 0.15 at. % to 10 at. % This memory element may have a wide bandgap (e.g., between 0.6 eV and 0.9 eV) and a short SET duration (e.g., <10 μs) and may be incorporated into a reduced-size memory cell 105, which may benefit from the similar or larger sensing window of the wide bandgap memory element while maintaining SET compliance.

In some memory architectures, accessing the memory cell 105 may degrade or destroy the stored logic state and re-write or refresh operations may be performed to return the original logic state to memory cell 105. But in non-volatile memory, such as chalcogenide-based or PCM, accessing the memory cell 105 may not destroy the logic state and, thus, the memory cell 105 may not require re-writing after accessing.

The memory controller 140 may control the operation (read, write, re-write, refresh, discharge, etc.) of memory cells 105 through the various components, for example, row decoder 120, column decoder 130, and sense component 125. In some cases, one or more of the row decoder 120, column decoder 130, and sense component 125 may be co-located with the memory controller 140. Memory controller 140 may generate row and column address signals in order to activate the desired word line 110 and bit line 115. Memory controller 140 may also generate and control various voltage potentials or currents used during the operation of memory array 100. For example, it may apply discharge voltages to a word line 110 or bit line 115 after accessing one or more memory cells 105.

In general, the amplitude, shape, or duration of an applied voltage or current discussed herein may be adjusted or varied and may be different for the various operations discussed in operating memory array 100. Furthermore, one, multiple, or all memory cells 105 within memory array 100 may be accessed simultaneously; for example, multiple or all cells of memory array 100 may be accessed simultaneously during an operation in which all memory cells 105, or a group of memory cells 105, are set to a single logic state. The reliability with which the memory controller 140 may access memory cells 105 may increase for memory cells 105 using a transition metal doped GST composition because the sensing window of memory cell 105 may be increased. At the same time, a timing with which the memory controller 140 may access memory cells 105 may remain the same or decrease for memory cells 105 using a transition metal doped GST composition because the SET speed of the memory cell 105 may be maintained or reduced.

Figure 2:
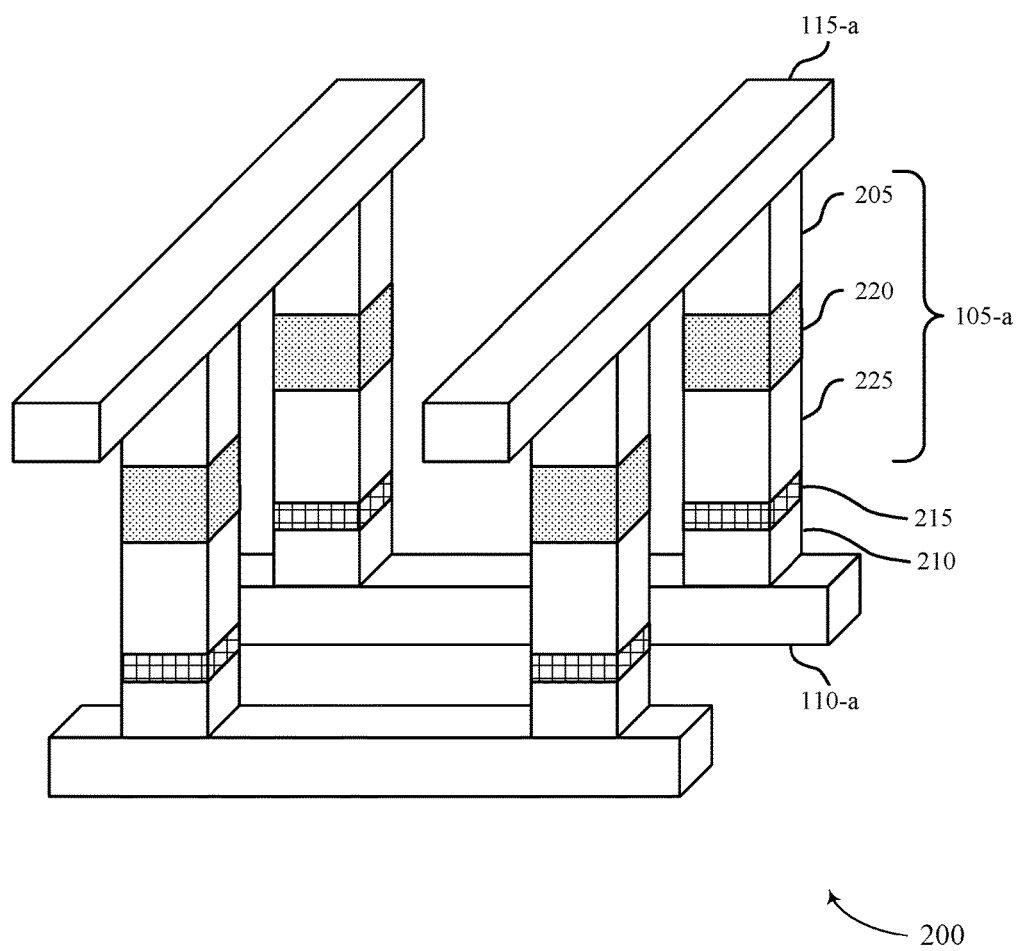
FIG. 2 illustrates an example cross-section of a memory array that supports transition metal doped GST in accordance with various aspects of the present disclosure.

FIG. 2 illustrates an example cross-section of a memory array that supports transition metal doped GST in accordance with various aspects of the present disclosure. Memory array 200 may be configured to store electronic data and may be an example of aspects of memory array 100 of FIG. 1. Memory array 200 includes memory cell 105-a, first access line 110-a (e.g. word line 110-a), and second access line 115-a (e.g. bit line 115-a), which may be examples of a memory cell 105, word line 110, and bit line 115, as described with reference to FIG. 1.

In some cases, a three-dimensional (3D) memory array may be formed by stacking multiple memory arrays 200 on one another. The two stacked arrays may, in some examples, have common conductive lines such that each level may share word lines 110 or bit lines 115 as described with reference to FIG. 1. In some examples, memory array 200 may include additional access lines, including an additional access line that is in electronic communication with selector device 215. For example, when selector device 215 is a three-terminal device, an additional access line may be used to activate and deactivate selector device 215.

Memory array 200 may be referred to as a cross-point architecture. It may also be referred to as a pillar structure. For example, as shown in FIG. 2, a pillar may be in contact with a first conductive line (first access line 110-a) and a second conductive line (bit line 115-a), where the pillar comprises first electrode 210, selector device 215, and memory cell 105-a, which may include second electrode 225, memory element 220, and third electrode 205. First electrode 210 may be referred to as bottom electrode 210, second electrode 225 may be referred to as middle electrode 225 or as the bottom electrode of memory cell 105-a, and third electrode 205 may be referred to as top electrode 205.

Such a pillar architecture may offer relatively high-density data storage with lower production costs compared to other memory architectures. For example, the cross-point architecture may have memory cells with a reduced area and, resultantly, an increased memory cell density compared to other architectures. For example, the architecture may have a $4F^2$ memory cell area, where F is the smallest feature size, compared to other architectures with a $6F^2$ memory cell area, such as those with a three-terminal selection.

Memory cell 105-a may be electronically programmable to be in different states and may be configured to store a logic value corresponding to a particular state. Memory cell 105-a includes second electrode 225, third electrode 205, and memory element 220, which may include a phase change material. Memory cell 105-a may be a target memory cell.

Selector device 215 may, in some cases, be connected in series between a memory cell 105 and a conductive line, for example, between memory cell 105-a and at least one of first access line 110-a or bit line 115-a. For example, as depicted in FIG. 2, selector device 215 may be located between bottom electrode 210 and middle electrode 225; thus, selector device 215 is located in series between memory cell 105-a and first access line 110-a. Other configurations are possible. For example, selector device 215 may be located in series between memory cell 105-a and bit line 115-a.

Selector device 215 may aid in selecting a particular memory cell 105-*a* or may help prevent stray currents from flowing through non-selected memory cells 105-*a* adjacent a selected memory cell 105-*a*. For example, selector device 215 may have a threshold voltage such that a current flows through selector device 215 when the threshold voltage is met or exceeded. The selection of memory cell 105-*a* may be a function of the threshold voltage of the selector device 215. Selector device 215 may also be referred to as a selection component. In some cases, selector device 215 may include a metal-oxide-semiconductor field-effect transistor (MOSFET), bipolar junction transistor (BJT), diode, or ovonic threshold switch (OTS).

Selector device 215 may be coupled with the memory element 220. The selector device 215 and the memory element 220 may be arranged in a series configuration between the first access line 110-*a* and the bit line 115-*a*. A selector device 215 may include a first chalcogenide material. In some cases, a selector device 215 may comprise a first chalcogenide material and a memory element 220 may comprise a different composition (e.g., a second chalcogenide material) than the selector device 215. Although the example of memory array 200 illustrated in FIG. 2 includes a separate memory element and selector device, in some cases, a memory cell 105 may not include a separate memory element and selector device. This type of memory architecture may be referred to as self-selecting memory, and the selector device 215 may serve as the memory element, or vice versa. A memory device may therefore include a memory cell that comprises a self-selecting memory device. For example, a single element that includes a chalcogenide material may serve as both a memory element and a selector device such that a separate selector device may be unncessary.

Memory element 220 may include a material having a programmable resistance. In some cases, the material may exhibit a different resistivity (e.g., resistance and/or voltage threshold) based on a phase (e.g., amorphous phase or crystalline phase) of the material, and may be referred to a phase change material. As discussed herein, a phase of the phase change material may be changed by applying and removing voltages to/from memory element 220.

Memory element 220 may be accessed via selector device 215. For example, when a voltage across selector device 215 reaches a threshold value, current may flow between access lines 110-*a* and 115-*a* through memory element 220. This flow of current may be used to write a logic value to memory element 220. A write operation may include applying a voltage to memory element 220 that heats memory element 220 to a glass transition temperature. After memory element 220 reaches the glass transition temperature, the voltage may be removed and the memory element 220 may cool. During the cooling period, the atoms within memory element 220 may be arranged in accordance with a particular phase. For example, for a crystalline phase, octahedral bonding geometry may form between all or most atoms of memory element 220, and for an amorphous phase, varying bonding configurations may form between the atoms of memory element 220. Whether memory element 220 exhibits a crystalline phase or an amorphous phase may be based on how the voltage is removed from and whether additional voltage is applied to memory element 220 during the cooling period.

To store a different logic value at memory element 220 that is in an amorphous phase, the write operation may include transitioning memory element 220 from the amorphous phase to a crystalline phase. The duration for transitioning memory element 220 from an amorphous to a crystalline phase may be referred to as the SET duration. In some cases, a length of the SET duration for memory element 220 is based on a composition that includes memory element 220. For instance, the SET duration may be shorter for certain compositions than for others. As discussed herein, the SET duration may be correlated with the threshold voltage window of memory element 220—e.g., as the threshold voltage window increases, a length the SET duration also increases.

A flow of current through memory element 220 may also be used to read a logic value stored at memory element 220. When reading memory element 220, the difference between the threshold voltage across selector device 215 at which current begins to flow and the threshold voltage window of memory element 220 may be referred to as a sensing window. In some cases, the larger the sensing window of memory element 220, the more reliable memory cell 105-*a*. As discussed herein, the threshold voltage window of memory element may be based on a size of memory element 220—e.g., as memory element 220 is decreased in size, the threshold voltage window may also decrease—and/or a bandgap of a composition included in memory element 220—e.g., as a bandgap of the composition increases, the threshold voltage window of memory element 220 increases. However, as discussed herein, increasing the threshold voltage window of memory element 220 may result in a decrease in a SET duration for memory element 220. Similarly, when a size of memory element 220 is decreased, using compositions with higher bandgaps to increase a threshold voltage window of memory element 220 may also result in a decrease in a SET duration for memory element 220.

As discussed herein, in some cases, memory element 220 includes a high bandgap composition that increases a threshold voltage window of memory element 220 while maintaining or increasing a SET speed of memory element 220. For example, memory element include a phase change material that includes a combination of Ge, Sb, Te, and at least one Group III-TM element. For example, memory element 220 may include a phase change material that includes Ge in an amount ranging from 15 to 35 at. % of the composition; Sb in an amount less than or equal to 50 at. % of the composition; Te in an amount greater than or equal to 40 at. % of the composition, and at least one element selected from a group consisting of yttrium and scandium, in an amount ranging from 0.15 to 10 at. % of the composition. As discussed herein, a composition created in accordance with these ranges may have a large bandgap (e.g., between 0.6 and 0.9 electronvolts (eVs)) and a quick SET speed (e.g., less than 10 µs).

Memory array 200 may be made by various combinations of material formation and removal. For example, layers of material may be deposited that correspond to the first access line 110-*a*, bottom electrode 210, selector device 215, middle electrode 225, memory element 220, and top electrode 205. Material may be selectively removed to then create the desired features, such as the pillar structure depicted in FIG. 2. For example, features may be defined using photolithography to pattern a photoresist and then material may be removed by techniques such as etching. Bit line 115-*a* may then be formed, for example, by depositing a layer of material and selectively etching to form the line structure depicted in FIG. 2. In some cases, electrically insulating regions or layers may be formed or deposited. The electrically insulating regions may include oxide or nitride materials, such as silicon oxide, silicon nitride, or other electrically insulating materials Various techniques may be used to form materials or components of memory array 200. These may include, for example, chemical vapor deposition (CVD), metal-organic chemical vapor deposition (MOCVD), physical vapor deposition (PVD), sputter deposition, atomic layer deposition (ALD), or molecular beam epitaxy (MBE), among other thin film growth techniques. Material may be removed using a number of techniques, which may include, for example, chemical etching (also referred to as "wet etching"), plasma etching (also referred to as "dry etching"), or chemical-mechanical planarization.

Figure 3:
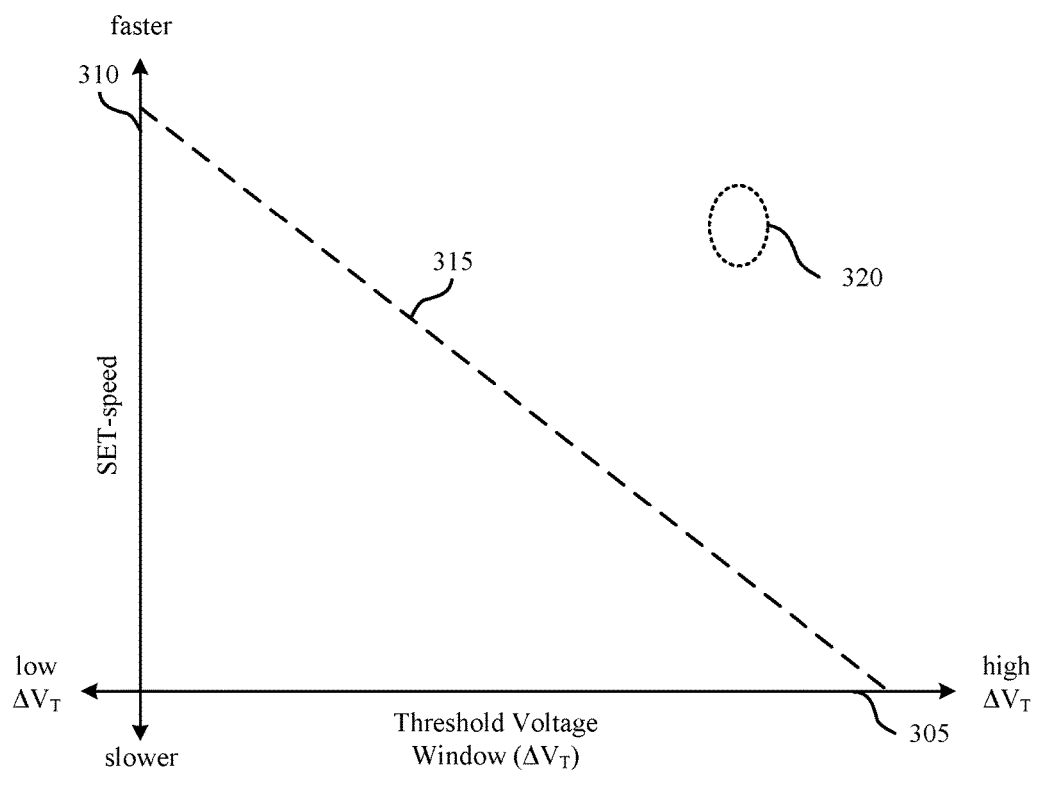
FIG. 3 illustrates an example of a plot for transition metal doped GST in accordance with various aspects of the present disclosure.

FIG. 3 illustrates an example of a plot that illustrates characteristics of transition metal doped GST in accordance with various aspects of the present disclosure. Plot 300 illustrates a relationship between a relative crystallization speed of a memory element and a sensing window for a memory element and/or memory cell, such as memory element 220 (and/or selector device 215) and memory cell 105-a of FIG. 2, in terms of voltage. Plot 300 includes sensing window axis 305, SET speed axis 310, trend line 315, and region 320 for a transition metal-doped GST.

Sensing window axis 305 provides sensing window values in an increasing order from left to right. That is, the left side of sensing window axis 305 corresponds to small sensing windows while the right side of sensing window axis 305 corresponds to larger, more desirable sensing windows. As discussed herein, a sensing window for a memory cell may be related to a threshold voltage window of a corresponding memory element—e.g., a memory element having a high threshold voltage window often corresponds to a memory cell having a large sensing window. And the threshold voltage window of a memory element may be related to a size of the memory element—e.g., a threshold voltage window of a memory element often decreases as the size of a memory element is decreased—and a bandgap of a composition included in the memory element—e.g., a composition with a larger bandgap often results in a memory element having a larger threshold voltage window.

SET speed axis 310 provides SET speed values in a decreasing order from top to bottom. That is, the bottom of SET speed axis 310 corresponds to slower crystallization speeds while the top of SET speed axis 310 corresponds to faster, more desirable crystallization speeds. As discussed herein, a SET speed for a memory cell may be related to a bandgap of a corresponding memory element—e.g., a memory element having a large bandgap often has a slow SET speed.

In some cases, a bandgap of a GST composition may be based on the Sb—Te bonds of the GST composition. In some cases, the bandgap of the GST composition may be increased by replacing Sb atoms (which has an electronegativity of 2.05) with atoms having a higher electronegativity difference relative to Te (which has an electronegativity of 2.10), such as In atoms (In has an electronegativity of 1.78). However, increasing the bandgap of the doped composition by replacing the Sb atoms with elements having a higher electronegativity difference relative to Te, such as In, may also decrease a SET speed of the doped composition—e.g. due to the tetrahedral bonds of In which decrease the number of four-fold rings, which may act as nuclei for crystallization. Thus, for example, a composition with more four-fold rings may have a faster SET speed than a composition with less four-fold rings.

Thus, as a threshold voltage window of a memory element, and a sensing window of a corresponding memory cell, is increased—e.g., by selecting a composition having a large bandgap for the memory element—a SET speed of the memory element, and the corresponding memory cell, often decreases. Trend line 315 illustrates this relationship between sensing window size and crystallization speed for a memory element/cell.

This relationship suggests a trade-off between compositions with high bandgaps and compositions with high SET speeds when selecting a composition to use for a memory element. That is, compositions with narrow bandgaps and higher SET speeds may in some cases be used for the memory element despite a smaller sensing window resulting for a corresponding memory cell. For example, material compositions used in memory cells represented by trend line 315 may be pure GST compositions (i.e. including only Ge, Sb, Te) or Q-GST compositions where Q may be an element that is not a Group III-TM element (e.g., In-GST). Some compositions used for memory elements/cells represented by trend line 315 may include IST, GST, IGT, and the like.

The effects of the sensing window/SET speed relationship may be further emphasized as a size of memory cells are decreased. As discussed herein, a threshold voltage window of a memory element, and thus a sensing window of a memory cell, may decrease as a size of the memory element is decreased. Thus, a memory element using a first composition may have a first threshold voltage window at a first size and a second threshold voltage window at a second size, while a SET speed of the memory element may be relatively unchanged. And as a size of memory elements continues to decrease—e.g., to increase the density of a memory array—compositions with larger bandgaps may be used to increase a sensing window of a corresponding memory cell. But as discussed herein, using compositions with larger bandgaps may cause a SET speed of the memory cell to slow. In some cases, the SET speed of a memory cell can slow to a degree that a duration for transitioning a corresponding memory element from an amorphous to crystalline phase (which may be referred to as the SET duration) exceeds a timing constraint for a memory operation.

To increase a reliability and/or throughput of a memory system, a memory system may employ a composition as disclosed herein, which results in a deviation of a memory cell from trend line 315—i.e., a composition having a relatively high bandgap and a relatively fast SET speed that results in a memory cell with a relatively large sensing window and a relatively fast SET speed.

For example, as disclosed herein a memory cell containing a memory element using a composition that includes a combination of Ge, Sb, Te, and a Group III-TM element may have a relatively high sensing window and a relatively fast SET speed, represented by region 320—region 320 may encompass a range of sensing window/SET speed combinations achievable by a composition using a combination of Ge, Sb, Te, and a Group III-TM element. As discussed herein, a bandgap of GST may be based on its Sb—Te bonds and increased by replacing Sb atoms with atoms of an element having higher electronegativity difference relative to Te. Group III-TM elements, such as Y (which has an electronegativity of 1.22) or Sc (which has an electronegativity of 1.36), may also have a higher electronegativity difference relative to Te than Sb, and may be used to increase a bandgap of the GST composition. However, Group III-TM elements, such as Y and Sc, may be introduced to a GST composition with little to no decrease, or an increase, in the SET speed of the GST composition. The SET speed of the Group III-TM doped GST may be maintained or increased due to the d-type orbitals of the Group III-TM elements, which do not depress the formation of four-fold rings, which act as nuclei for crystallization. Such a composition is discussed in more detail herein, and at least with reference to FIG. 4.

It is worth noting that doping an Sb—Te (ST) composition, such as $Sb_2Te_3$, with a Group III-TM element (e.g., to create Sc—Sb—Te (ScST) or Y—Sb—Te (YST)) may fail to provide a composition with a wide bandgap and a desirable SET speed. In some cases, doping an ST composition with a Group III-TM element may fail to provide a wide bandgap composition because of the relatively narrower bandgap of the baseline ST composition (e.g., around 0.55 eV). That is, the effect of the Group III-TM doping on an ST composition may not be strong enough to yield a Group III-TM doped ST composition with a wide bandgap (e.g., greater than 0.65 eV).

By way of example, a composition included in a memory element corresponding to a sensing window/SET speed combination within region 320 may have Ge in an amount ranging from 15 to 35 at. %, Sb in an amount less than or equal to 50 at. %, Te in an amount greater than or equal to 40 at. %, and at least one element selected from a group consisting of Y and Sc, in an amount ranging from 0.15 to 10 at. %. This composition may have a bandgap energy value ranging from 0.6 to 0.9 eVs and a SET speed that corresponds to a SET duration of less than 10 μs. In some cases, such a composition may be used in memory cells to increase a reliability of a corresponding memory array—e.g., by increasing a sensing window of the memory cells while maintaining or reducing SET duration. Such a composition may also be used in memory cells to maintain a sensing window of the memory cells as a size of a corresponding memory array is decreased.

Figure 4:
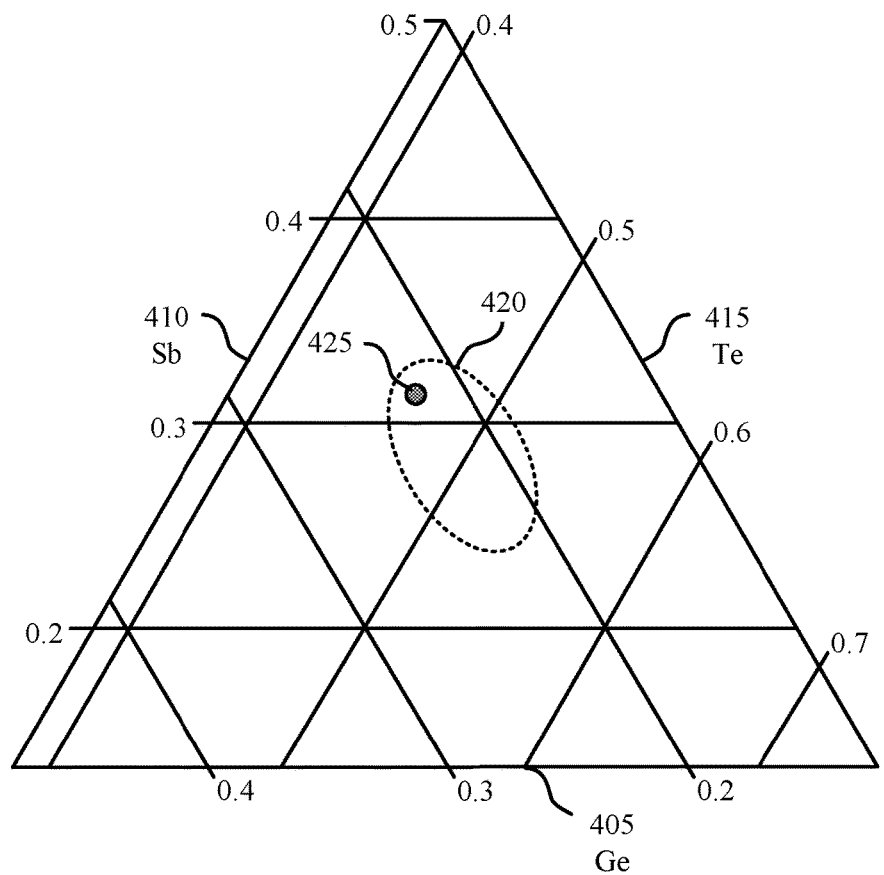
FIG. 4 illustrates an example ternary diagram showing example transition metal doped GST compositions in accordance with various aspects of the present disclosure.

FIG. 4 illustrates an example ternary diagram showing example transition metal doped GST compositions in accordance with various aspects of the present disclosure. Plot 400 illustrates first axis 405, second axis 410 and third axis 415.

First axis 405 may represent atomic percentages of Ge. Second axis 410 may represent atomic percentages of Sb. Third axis 415 may represent atomic percentages of Te. Region 420 may encompass different GST compositions that may be doped with a Group III-TM element, such as Y or Sc. Data point 425 may represent a composition that includes GST prior to the addition of a Group III-TM element.

As described herein, compositions with an increased or maintained energy bandgap and a maintained or increased SET speed/reduced SET duration may be useful for memory elements and may include some combination of Ge, Sb, Te, and at least one Group III-TM element. A chalcogenide material composition may result in the general formula $Ge_xSb_yTe_zQ_w$, where Q is one of the Group III-TM elements. A Group III-TM element may be at least one element selected from a group consisting of Y or Sc. As discussed herein, a chalcogenide material composition may be comprised of the compositions identified in Table 1, which may provide composition ranges by atomic percentages of Ge, Sb, Te, and a Group III-TM element.

TABLE 1

|  | Ge | Sb | Te | Group III-TM elements |
|---|---|---|---|---|
| First (at. %) | 15-35 | ≤50 | ≥40 | 0.15-10 |
| Second (at. %) | 15-35 | 25-35 | ≥40 | 0.15-10 |
| Third (at. %) | 25-45 | 0 | ≥40 | 0.15-20 |

As shown in Table 1, the GST composition may be doped so that the transition metal-doped GST composition includes a Group III-TM element in an amount ranging from 0.15 to 10 at. %. In some cases, a bandgap of the composition ranges from 0.6 to 0.9 electronvolts and may have a crystallization speed that is less than 10 μs.

In some cases, an increase in the atomic percent of the Group III-TM element in the Group III-TM doped GST results in a corresponding decrease in the Sb of the GST composition. In some examples, the Sb of the GST composition may be completely replaced by the transition metal in the transition metal doped GST composition resulting in a Group III-TM doped GT composition (e.g., ScGT or YGT). When the Sb of the GST is completely replaced by a Group III-TM element, such as Sc or Y, the amount of Ge or Te in the Group III-TM doped GT composition may be increased accordingly—for example, the composition may include a Group III-TM element in an amount ranging from 0.15 to 20 at. % and the at. % of the Ge and Te may collectively compose 80 at. % or more of the Group III-TM doped GT composition.

In some examples, the amount of the Group III-TM element is less than 5 at. % of the transition metal doped GST composition. In some cases, the amount of germanium ranges from 15 to 25 at. % of the composition. In some cases, the amount of antimony ranges from 10 to 40 at. % of the composition. In some cases, the amount of tellurium by atomic percent is greater than the amount of germanium by atomic percent, is greater than the amount of antimony by atomic percent, and is greater than the amount of the at least one element by atomic percent (which may be referred to as a Te-rich composition). In some cases, the amount of tellurium ranges from 40 to 65 at. % of the composition. In some cases, the amount of tellurium ranges from 45 at. % to 55 at. % of the composition.

In some examples, a GST composition is doped to include 4 at. % of a Group III-TM element. For example, data point 425 may correspond to a GST composition including Ge in an amount of approximately 22 at. %, Sb in amount of approximately 32 at. %, and Te in an amount of approximately 46 at. % that is doped with Y in an amount of 4 at. %, which may result in a Y-GST composition including Ge in an amount of approximately 22 at. %, Sb in amount of approximately 28 at. %, Te in an amount of approximately 46 at. %, and Y in amount of 4 at. %. Such a Y-GST composition may have a bandgap of 0.67 eV and a SET speed of less than 10 μs.

Figure 5:
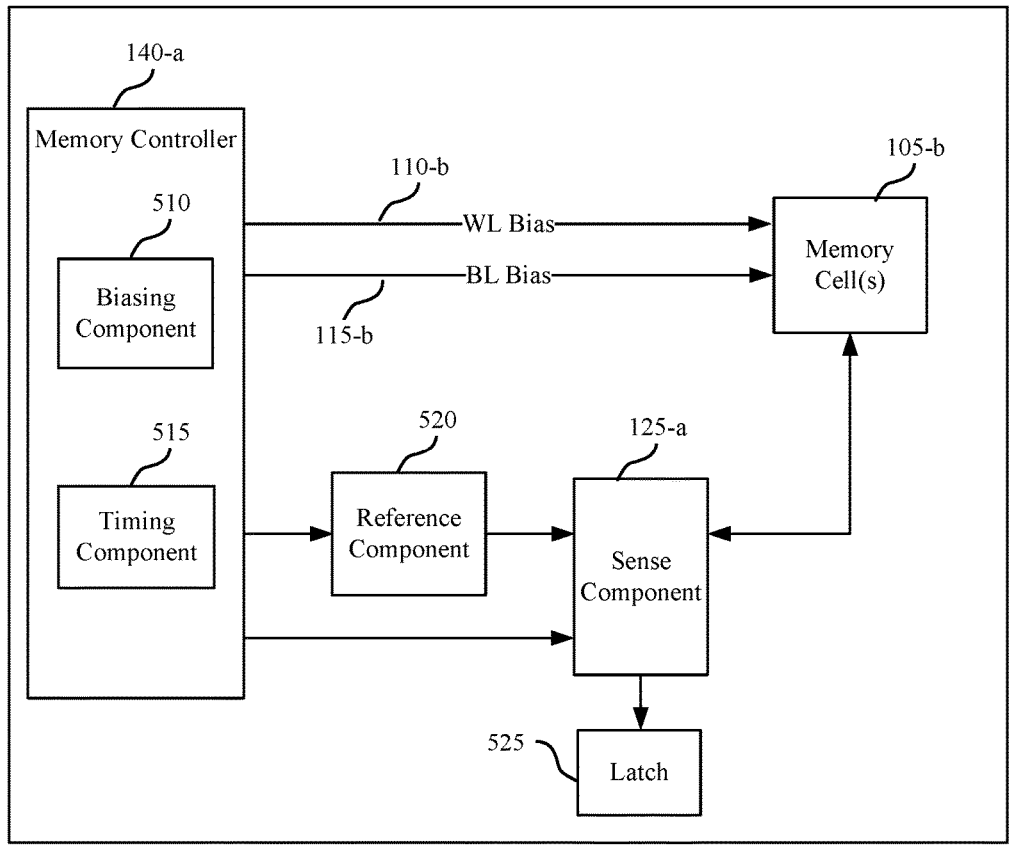
FIG. 5 illustrates an example memory array that supports transition metal doped GST in accordance with various embodiments of the present disclosure.

FIG. 5 illustrates an example memory array that supports transition metal doped GST in accordance with various embodiments of the present disclosure. Memory array 500 may be referred to as an electronic memory apparatus and includes memory controller 140-a and memory cell 105-b, which may be examples of memory controller 140 and memory cell 105 described with reference to FIG. 1. Memory array 500 may also include reference component 520 and latch 525. The components of memory array 500 may be in electronic communication with each other and may perform the functions described with reference to FIG. 1. In some cases, reference component 520, sense component 125-a and latch 525 may be components of memory controller 140-a.

Reference component 520 may include various components to generate a reference signal for sense component 125-a. Reference component 520 may include circuitry configured to produce a reference signal.

Memory cell 105-b may include one or more memory elements. Each of the memory elements may include a composition that includes a particular combination of Ge, Sb, Te, and one or more Group III-TM elements. A bandgap of the composition may be between 0.6 to 0.9 eV and a SET speed of the composition may be less than 10 µs.

Sense component 125-a may compare a signal from memory cell 105-b (through bit line 115-b) with a reference signal from reference component 520. Upon determining the logic state, the sense component may then store the output in latch 525, where it may be used in accordance with the operations of an electronic device that memory array 500 is a part.

Memory controller 140-a may, in combination with other components apply voltages throughout memory array 500, write data to memory cells 105-b, read data from memory cells 105-b, and generally operate memory array 500 as described in FIG. 1. Memory controller 140-a may include biasing component 510 and timing component 515. Memory controller 140-a may be in electronic communication with word line 110-b, bit line 115-b, sense component and 125-a, which may be examples of a word line 110, bit line 115, and sense component 125, as described with reference to FIG. 1.

Memory controller 140-a may be configured to activate word line 110-b or bit line 115-b by applying voltages to those various nodes. For example, biasing component 510 may be configured to apply a voltage to operate memory cell 105-b to read or write memory cell 105-b as described herein. In some cases, memory controller 140-a may include a row decoder, column decoder, or both, as described with reference to FIG. 1. This may enable memory controller 140-a to access one or more memory cells 105. Biasing component 510 may also provide voltage potentials to reference component 520 in order to generate a reference signal for sense component 125-a. Additionally, biasing component 510 may provide voltage potentials for the operation of sense component 125-a.

In some cases, memory controller 140-a may perform its operations using timing component 515. For example, timing component 515 may control the timing of the various word line selections or plate biasing, including timing for switching and voltage application to perform the memory functions, such as reading and writing, discussed herein. In some cases, timing component 515 may control the operations of biasing component 510.

Figure 6:
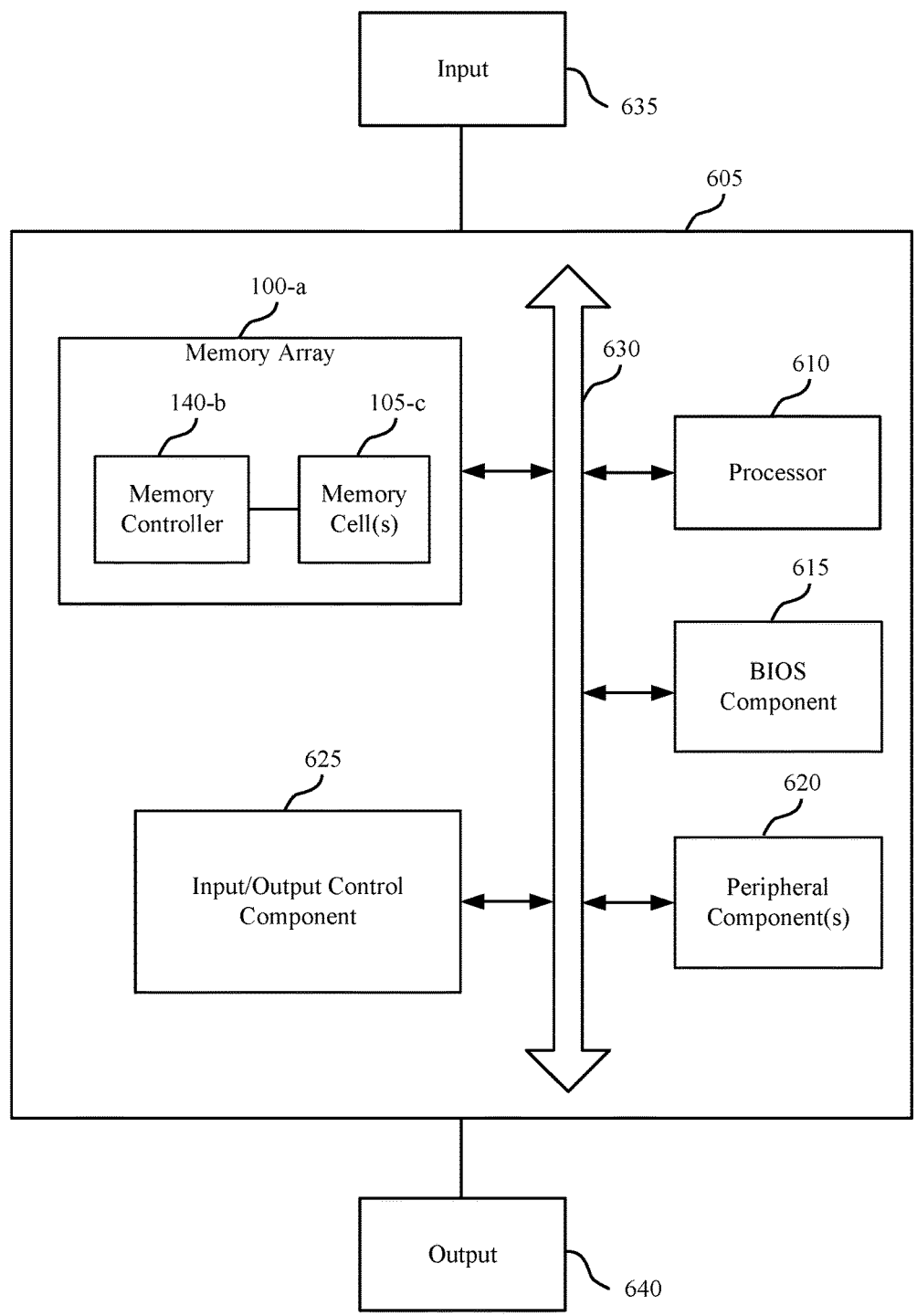
FIG. 6 illustrates an example system that supports transition metal doped GST and related memory devices in accordance with various embodiments of the present disclosure.

In some cases, memory controller 140-a may be used to access memory cell(s) 105-b for memory operations (such as read and write operations). For example, memory controller 140-a may select, for a memory operation, memory cell(s) 105-b comprising a memory element having a composition comprising: germanium in an amount ranging from 15 atomic percent (at. %) to 35 at. %; antimony in an amount less than or equal to 50 at. %; tellurium in an amount greater than or equal to 40 at. %; and at least one element selected from a group consisting of yttrium and scandium, in an amount ranging from 0.15 at. % to 10 at. %; and apply, during the memory operation, one or more voltages to the memory cell(s) 105-b based at least in part on the memory operation and the composition FIG. 6 illustrates an example system that supports transition metal doped GST in accordance with various embodiments of the present disclosure. System 600 includes a device 605, which may be or include a printed circuit board to connect or physically support various components. Device 605 includes a memory array 100-a, which may be an example of memory array 100 described with reference to FIG. 1. Memory array 100-a may contain memory controller 140-b and memory cell(s) 105-c, which may be examples of memory controller 140 and memory cells 105 described with reference to FIGS. 1 and 5. Device 605 may also include a processor 610, BIOS component 615, peripheral component(s) 620, and input/output control component 625. The components of device 605 may be in electronic communication with one another through bus 630.

Processor 610 may be configured to operate memory array 100-a through memory controller 140-b. In some cases, processor 610 may perform the functions of memory controller 140 described with reference to FIGS. 1 and 5. In other cases, memory controller 140-b may be integrated into processor 610. Processor 610 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components, and processor 610 may perform various functions described herein. Processor 610 may, for example, be configured to execute computer-readable instructions stored in memory array 100-a to cause device 605 perform various functions or tasks.

BIOS component 615 may be a software component that includes a basic input/output system (BIOS) operated as firmware, which may initialize and run various hardware components of system 600. BIOS component 615 may also manage data flow between processor 610 and the various components, e.g., peripheral components 620, input/output control component 625, etc. BIOS component 615 may include a program or software stored in read-only memory (ROM), flash memory, or any other non-volatile memory.

Peripheral component(s) 620 may be any input or output device, or an interface for such devices, that is integrated into device 605. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input/output control component 625 may manage data communication between processor 610 and peripheral component(s) 620, input devices 635, or output devices 640. Input/output control component 625 may also manage peripherals not integrated into device 605. In some cases, input/output control component 625 may represent a physical connection or port to the external peripheral.

Input 635 may represent a device or signal external to device 605 that provides input to device 605 or its components. This may include a user interface or interface with or between other devices. In some cases, input 635 may be a peripheral that interfaces with device 605 via peripheral component(s) 620 or may be managed by input/output control component 625.

Output 640 may represent a device or signal external to device 605 configured to receive output from device 605 or any of its components. Examples of output 640 may include a display, audio speakers, a printing device, another processor or printed circuit board, etc. In some cases, output 640 may be a peripheral that interfaces with device 605 via peripheral component(s) 620 or may be managed by input/output control component 625.

The components of memory controller 140-b, device 605, and memory array 100-a may be made up of circuitry designed to carry out their functions. This may include various circuit elements, for example, conductive lines, transistors, capacitors, inductors, resistors, amplifiers, or other active or inactive elements, configured to carry out the functions described herein.

Figure 7:
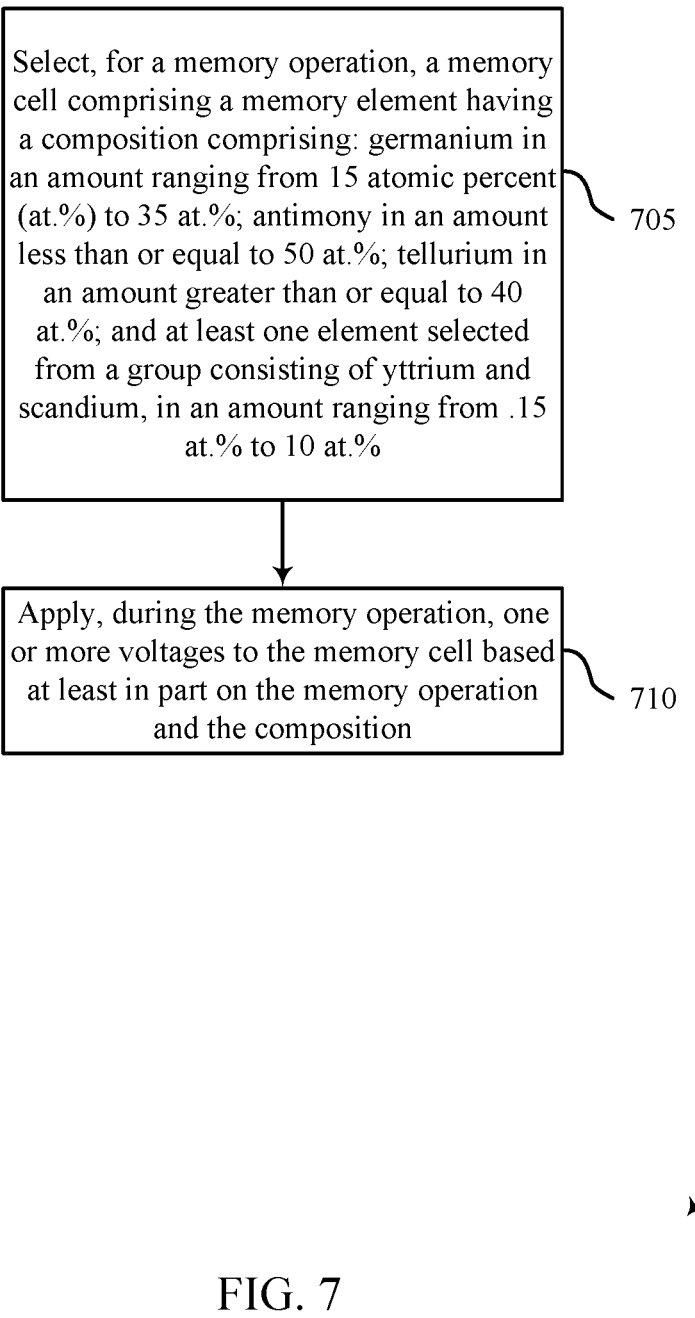
FIG. 7 illustrates a flowchart of a method or methods for transition metal doped GST in accordance with various embodiments of the present disclosure.

FIG. 7 illustrates a flowchart of a method or methods for transition metal doped GST in accordance with various embodiments of the present disclosure. Method 700 may illustrate aspects of programming a resistance of a memory cell containing a Group III-TM doped GST composition.

At block 705, the method may include selecting, for a memory operation, a memory cell comprising a memory element having a composition comprising: Ge in an amount ranging from 15 atomic percent (at. %) to 35 at. %; Sb in an amount less than or equal to 50 at. %; Te in an amount greater than or equal to 40 at. %; and at least one element selected from a group consisting of Y and Sc, in an amount ranging from 0.15 at. % to 10 at. %, as described with reference to FIGS. 1-5. In certain examples, the operations of block 705 may be performed or facilitated by a memory controller, as described with reference to FIGS. 1, 5, and 6.

At block 710, the method may include applying, during the memory operation, one or more voltages to the memory cell based at least in part on the memory operation and the composition, as described with reference to FIGS. 1-5. In certain examples, the operations of block 710 may be performed or facilitated by a memory controller, as described with reference to FIGS. 1, 5, and 6.

In some examples, an apparatus as described herein may perform a method or methods, such as the method 700. The apparatus may include features, means, or instructions (e.g., a non-transitory computer-readable medium storing instructions executable by a processor) for selecting, for a memory operation, a memory cell comprising a memory element having a composition comprising: Ge in an amount ranging from 15 atomic percent (at. %) to 35 at. %; Sb in an amount less than or equal to 50 at. %; Te in an amount greater than or equal to 40 at. %; and at least one element selected from a group consisting of Y and Sc, in an amount ranging from 0.15 at. % to 10 at. %; and applying, during the memory operation, one or more voltages to the memory cell based at least in part on the memory operation and the composition.

It should be noted that the methods described above describe possible implementations, and that the operations and the steps may be rearranged or otherwise modified and that other implementations are possible. Furthermore, embodiments from two or more of the methods may be combined.

In some examples, an apparatus or device may perform aspects of the functions described herein using general, or special-purpose hardware. For example, an apparatus or device may include a selector device and a memory element coupled with the selector device, the memory element having a composition comprising: Ge in an amount ranging from 15 at. % to 35 at. %; Sb in an amount less than or equal to 50 at. %; Te in an amount greater than or equal to 40 at. %; and at least one element selected from a group consisting of Y and Sc in an amount ranging from 0.15 at. % to 10 at. %.

In some examples of the apparatus or device, the at least one element selected from the group is yttrium. In some examples of the apparatus or device, the amount of the yttrium ranges from 1 at. % to 5 at. %.

In some examples of the apparatus or device, a height of the memory element ranges from 20 nanometers to 40 nanometers and a width of the memory element ranges from 5 nanometers to 50 nanometers.

In some examples of the apparatus or device, a bandgap of the memory element ranges from 0.6 electronvolts and 0.9 electronvolts and a crystallization speed of the memory element is less than 10 microseconds.

In some examples of the apparatus or device, the selector device comprises any one of a metal-oxide-semiconductor field-effect transistor (MOSFET), bipolar junction transistor (BJT), diode, or an ovonic threshold switch.

In another example, an apparatus or device may include a first access line; a second access line; a first memory cell that includes a chalcogenide material comprising a composition that includes germanium, antimony, tellurium, and at least one of yttrium and scandium, wherein the first access line is coupled with the second access line via the first memory cell.

In some examples of the apparatus or device, the composition that includes the chalcogenide material comprises: Ge in an amount ranging from 15 at. % to 35 at. %; Sb in an amount less than or equal to 50 at. %; Te in an amount greater than or equal to 40 at. %; and at least one element selected from a group consisting of Y and Sc in an amount ranging from 0.15 at. % to 10 at. %.

In some examples of the apparatus or device, the at least one element selected from the group is yttrium. In some examples of the apparatus or device, an amount of the yttrium ranges from 0.5 at. % to 5 at. %.

In some examples, the apparatus or device includes a second memory cell coupled with the first memory cell, wherein a distance between a center of the second memory cell and a center of the first memory cell ranges from 10 nanometers to 45 nanometers.

In some examples of the apparatus or device, the first access line and the second access line are arranged in a three dimensional cross-point configuration and the apparatus or device includes a third access line, wherein the first access line and the third access line are arranged in the three dimensional cross-point configuration and are coupled with the second memory cell.

In some examples of the apparatus or device, the first memory cell comprises a selector device and a memory element that comprises the chalcogenide material, wherein a height of the memory element ranges from 20 nanometers to 40 nanometers and a width of the memory element ranges from 5 nanometers to 50 nanometers.

In some examples, the apparatus or device includes a selector device and a third access line that is coupled with the selector device and electronically isolated from the memory cell by the selector device.

The description herein provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. Also, features described with respect to some examples may be combined in other examples.

The description set forth herein, in connection with the appended drawings, describes example configurations and does not represent all the examples that may be implemented or that are within the scope of the claims. The terms "example," "exemplary," and "embodiment," as used herein, mean "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. When the first reference label is used in the specification, the description is applicable to any one of the similar components having the same first reference label irrespective of the second reference label.

The term "electronic communication" and "coupled" refer to a relationship between components that support electron flow between the components. This may include a direct connection between components or may include intermediate components. Components in electronic communication or coupled to one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (i.e., open or closed).

The term "isolated" or "electrically isolated" refers to a relationship between components in which electrons are not presently capable of flowing between them; components are isolated from each other if there is an open circuit between them. For example, two components physically connected by a switch may be isolated from each other when the switch is open.

The term "layer" used herein refers to a stratum or sheet of a geometrical structure. Each layer may have three dimensions (e.g., height, width, and depth) and may cover some or all of a surface. For example, a layer may be a three-dimensional structure where two dimensions are greater than a third. Layers may include different elements, components, and/or materials. In some cases, one layer may be composed of two or more sublayers. In some of the appended figures, two dimensions of a three-dimensional layer are depicted for purposes of illustration. Those skilled in the art will, however, recognize that the layers are three-dimensional in nature.

As used herein, the term "substantially" means that the modified characteristic (e.g., a verb or adjective modified by the term substantially) need not be absolute but is close enough so as to achieve the advantages of the characteristic.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory array 100.

The term "photolithography," as used herein, may refer to the process of patterning using photoresist materials and exposing such materials using electromagnetic radiation. For example, a photoresist material may be formed on a base material by, for example, spin-coating the photoresist on the base material. A pattern may be created in the photoresist by exposing the photoresist to radiation. The pattern may be defined by, for example, a photo mask that spatially delineates where the radiation exposes the photoresist. Exposed photoresist areas may then be removed, for example, by chemical treatment, leaving behind the desired pattern. In some cases, the exposed regions may remain and the unexposed regions may be removed.

The devices discussed herein, including memory array 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

Chalcogenide materials may be materials or alloys that include at least one of the elements S, Se, and Te. Phase change materials discussed herein may be chalcogenide materials. Chalcogenide materials may include alloys of S, Se, Te, Ge, As, Al, Sb, Au, indium (In), gallium (Ga), tin (Sn), bismuth (Bi), palladium (Pd), cobalt (Co), oxygen (O), silver (Ag), nickel (Ni), platinum (Pt). Example chalcogenide materials and alloys may include, but are not limited to, Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, or Ge—Te—Sn—Pt.

The hyphenated chemical composition notation, as used herein, indicates the elements included in a particular compound or alloy and is intended to represent all stoichiometries involving the indicated elements. For example, Ge—Te may include $Ge_xTe_y$, where x and y may be any positive integer. Other examples of variable resistance materials may include binary metal oxide materials or mixed valence oxide including two or more metals, e.g., transition metals, alkaline earth metals, and/or rare earth metals. Embodiments are not limited to a particular variable resistance material or materials associated with the memory elements of the memory cells. For example, other examples of variable resistance materials can be used to form memory elements and may include chalcogenide materials, colossal magnetoresistive materials, or polymer-based materials, among others.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The detailed description set forth above in connection with the appended drawings describes examples and does not represent the only examples that may be implemented or that are within the scope of the claims. The terms "example" and "exemplary," when used in this description, mean "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and apparatuses are shown in block diagram form in order to avoid obscuring the concepts of the described examples.

Information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and components described in connection with the disclosure herein may be implemented or performed with a general-purpose processor, a digital signal processor (DSP), an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope and spirit of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. As used herein, including in the claims, the term "and/or," when used in a list of two or more items, means that any one of the listed items can be employed by itself, or any combination of two or more of the listed items can be employed. For example, if a composition is described as containing components A, B, and/or C, the composition can contain A alone; B alone; C alone; A and B in combination; A and C in combination; B and C in combination; or A, B, and C in combination. Also, as used herein, including in the claims, "or" as used in a list of items (for example, a list of items prefaced by a phrase such as "at least one of" or "one or more of") indicates a disjunctive list such that, for example, a list of "at least one of A, B, or C" means A or B or C or AB or AC or BC or ABC (i.e., A and B and C).

Computer-readable media includes both computer storage media and communication media including any medium that facilitates transfer of a computer program from one place to another. A storage medium may be any available medium that can be accessed by a general purpose or special purpose computer. By way of example, and not limitation, computer-readable media can comprise RAM, ROM, EEPROM, flash memory, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The previous description of the disclosure is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not to be limited to the examples and designs described herein but is to be accorded the broadest scope consistent with the principles and novel features disclosed herein.

What is claimed is:

1. A composition of matter, comprising:
    germanium in an amount ranging from 15 atomic percent (at. %) to 35 at. % of the composition;
    antimony in an amount less than or equal to 50 at. % of the composition;
    tellurium in an amount greater than or equal to 40 at. % of the composition; and
    at least one element selected from a group consisting of yttrium and scandium, in an amount ranging from 0.15 at. % to 10 at. % of the composition.

2. The composition of claim 1, wherein the at least one element selected from the group is yttrium.

3. The composition of claim 2, wherein the amount of yttrium is less than 5 at. % of the composition.

4. The composition of claim 1, wherein the amount of tellurium by atomic percent is greater than the amount of germanium by atomic percent, is greater than the amount of antimony by atomic percent, and is greater than the amount of the at least one element by atomic percent.

5. The composition of claim 1, wherein the amount of the at least one element selected from the group consisting of yttrium and scandium is less than 5 at. % of the composition.

6. The composition of claim 1, wherein the amount of germanium ranges from 15 at. % to 25 at. % of the composition.

7. The composition of claim 1, wherein the amount of antimony ranges from 10 at. % to 40 at. % of the composition.

8. The composition of claim 1, wherein the amount of antimony ranges from 25 at. % to 35 at. % of the composition.

9. The composition of claim 1, wherein the amount of tellurium ranges from 40 at. % to 65 at. % of the composition.

10. The composition of claim 1, wherein the amount of tellurium ranges from 45 at. % to 55 at. % of the composition.

11. The composition of claim 1, wherein a bandgap of the composition ranges from 0.6 electronvolts and 0.9 electronvolts.

12. The composition of claim 11, wherein a crystallization speed of the composition is less than 10 microseconds.

13. An apparatus, comprising:
a selector device;
a memory element coupled with the selector device, the memory element having a composition comprising: germanium in an amount ranging from 15 at. % to 35 at. % of the composition; antimony in an amount less than or equal to 50 at. % of the composition;
tellurium in an amount greater than or equal to 40 at. % of the composition; and
at least one element selected from a group consisting of yttrium and scandium in an amount ranging from 0.15 at. % to 10 at. % of the composition.

14. The apparatus of claim 13, wherein the at least one element selected from the group is yttrium.

15. The apparatus of claim 14, wherein the amount of the yttrium ranges from 1 at. % to 5 at. % of the composition.

16. The apparatus of claim 13, wherein a height of the memory element ranges from 20 nanometers to 40 nanometers and a width of the memory element ranges from 5 nanometers to 50 nanometers.

17. The apparatus of claim 16, wherein a bandgap of the memory element ranges from 0.6 electronvolts and 0.9 electronvolts and wherein a crystallization speed of the memory element is less than 10 microseconds.

18. The apparatus of claim 13, wherein the selector device comprises any one of a metal-oxide-semiconductor field-effect transistor (MOSFET), bipolar junction transistor (BJT), diode, or an ovonic threshold switch.

19. An apparatus, comprising:
a first access line;
a second access line; and
a first memory cell that includes a chalcogenide material, wherein the first access line is coupled with the second access line via the first memory cell, and wherein a composition of the chalcogenide material comprises:
germanium in an amount ranging from 15 at. % to 35 at. % of the composition;
antimony in an amount less than or equal to 50 at. % of the composition;
tellurium in an amount greater than or equal to 40 at. % of the composition; and
at least one element selected from a group consisting of yttrium and scandium, in an amount ranging from 0.15 at. % to 10 at. % of the composition.

20. The apparatus of claim 19, wherein the at least one element selected from the group is yttrium.

21. The apparatus of claim 20, wherein an amount of the yttrium ranges from 0.5 at. % to 5 at. % of the composition.

22. The apparatus of claim 19, further comprising:
a second memory cell coupled with the first memory cell, wherein a distance between a center of the second memory cell and a center of the first memory cell ranges from 10 nanometers to 45 nanometers.

23. The apparatus of claim 22, wherein the first access line and the second access line are arranged in a three dimensional cross-point configuration, the apparatus further comprising:
a third access line, wherein the first access line and the third access line are arranged in the three dimensional cross-point configuration and are coupled with the second memory cell.

24. The apparatus of claim 19, wherein the first memory cell comprises:
a selector device; and
a memory element that comprises the chalcogenide material, wherein a height of the memory element ranges from 20 nanometers to 40 nanometers and a width of the memory element ranges from 5 nanometers to 50 nanometers.

25. The apparatus of claim 19, further comprising:
a selector device; and
a third access line that is coupled with the selector device and electronically isolated from the first memory cell by the selector device.

* * * * *